(12) United States Patent
Buijsse et al.

(10) Patent No.: US 12,009,176 B2
(45) Date of Patent: Jun. 11, 2024

(54) METHOD AND SYSTEM FOR GENERATING A DIFFRACTION IMAGE

(71) Applicant: FEI Company, Hillsboro, OR (US)

(72) Inventors: Bart Buijsse, Eindhoven (NL); Bart Jozef Janssen, Eindhoven (NL)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 18/321,442

(22) Filed: May 22, 2023

(65) Prior Publication Data
US 2023/0298853 A1    Sep. 21, 2023

Related U.S. Application Data

(62) Division of application No. 17/374,459, filed on Jul. 13, 2021, now Pat. No. 11,694,874.

(51) Int. Cl.
*H01J 37/26*    (2006.01)
*H01J 37/295*   (2006.01)

(52) U.S. Cl.
CPC .......... *H01J 37/265* (2013.01); *H01J 37/295* (2013.01); *H01J 2237/04* (2013.01)

(58) Field of Classification Search
CPC .. H01J 37/00; H01J 37/02; H01J 37/26; H01J 37/265; H01J 37/28; H01J 37/295; H01J 37/22; H01J 37/222; H01J 2237/04

USPC ......................................... 250/306, 307, 311
See application file for complete search history.

(56) References Cited

U.S. PATENT DOCUMENTS

| | | | |
|---|---|---|---|
| 2016/0005566 A1* | 1/2016 | Zewail | H01J 37/26 250/311 |
| 2017/0025247 A1* | 1/2017 | Stevens | H01J 37/28 |
| 2020/0400594 A1* | 12/2020 | Buijsse | G01N 23/2251 |
| 2022/0317067 A1* | 10/2022 | Buijsse | G01N 23/2055 |

* cited by examiner

*Primary Examiner* — Jason L McCormack

(57) ABSTRACT

Method and system for generating a diffraction image comprises acquiring multiple frames from a direct-detection detector responsive to irradiating a sample with an electron beam. Multiple diffraction peaks in the multiple frames are identified. A first dose rate of at least one diffraction peak in the identified diffraction peaks is estimated in the counting mode. If the first dose rate is not greater than a threshold dose rate, a diffraction image including the diffraction peak is generated by counting electron detection events. Values of pixels belonging to the diffraction peak are determined with a first set of counting parameter values corresponding to a first coincidence area. Values of pixels not belonging to any of the multiple diffraction peaks are determined using a second, set of counting parameter values corresponding to a second, different, coincidence area.

9 Claims, 6 Drawing Sheets

METHOD AND SYSTEM FOR GENERATING A DIFFRACTION IMAGE

CROSS-REFERENCE TO RELATED APPLICATIONS

This application is a divisional application under 35 U.S.C. § 120 of pending U.S. application Ser. No. 17/374,459, filed Jul. 13, 2021. The entire contents of the aforementioned application are incorporated by reference herein.

FIELD OF THE INVENTION

The present description relates generally to methods and systems for generating a diffraction image, and more particularly, to generating an electron diffraction image with a direct detection camera.

BACKGROUND OF THE INVENTION

Structures of macromolecules, such as proteins, may be determined based on electron diffraction patterns of crystals of these molecules. Accurate 3D-structure elucidation based on crystallographic data requires accurate capture of diffraction peak intensities. Detection of electron diffraction pattern generally requires a camera or detector with high dynamic range. Traditional scintillator-based cameras convert received electrons into photons before detected by an imaging sensor. These cameras have difficulty detecting weak diffraction peaks. Direct detection cameras directly detect image-forming electrons without a scintillator and may capture the weak diffraction peaks. However, Applicant recognizes that the dynamic range of electron counting using some direct detection camera may be limited. For example, for the relatively strong low resolution diffraction peaks, the dose rate at the peak positions will under typical experimental conditions outrun the allowed dose rate, and the detective quantum efficiency may reduce due to coincidence loss at high dose rate.

SUMMARY

In one embodiment, a method comprises irradiating a sample with an electron beam; acquiring multiple frames from a detector; identifying multiple diffraction peaks in the multiple frames; estimating a first dose rate of at least one diffraction peak in the identified diffraction peaks in a counting mode; responsive to the first dose rate not greater than a threshold dose rate, generating a diffraction image including the diffraction peak by counting electron detection events, wherein values of pixels belonging to the diffraction peak are determined using a first set of counting parameter values corresponding to a first coincidence area, and values of pixels not belonging to any of the multiple diffraction peaks are determined using a second set of counting parameter values corresponding to a second, different, coincidence area. In this way, the dynamic range of a direct detection camera working in an electron counting mode may be extended, and high-quality electron diffraction images can be obtained.

It should be understood that the summary above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE DRAWINGS

Like reference numerals refer to corresponding parts throughout the several views of the drawings.

DETAILED DESCRIPTION

Figure 1:
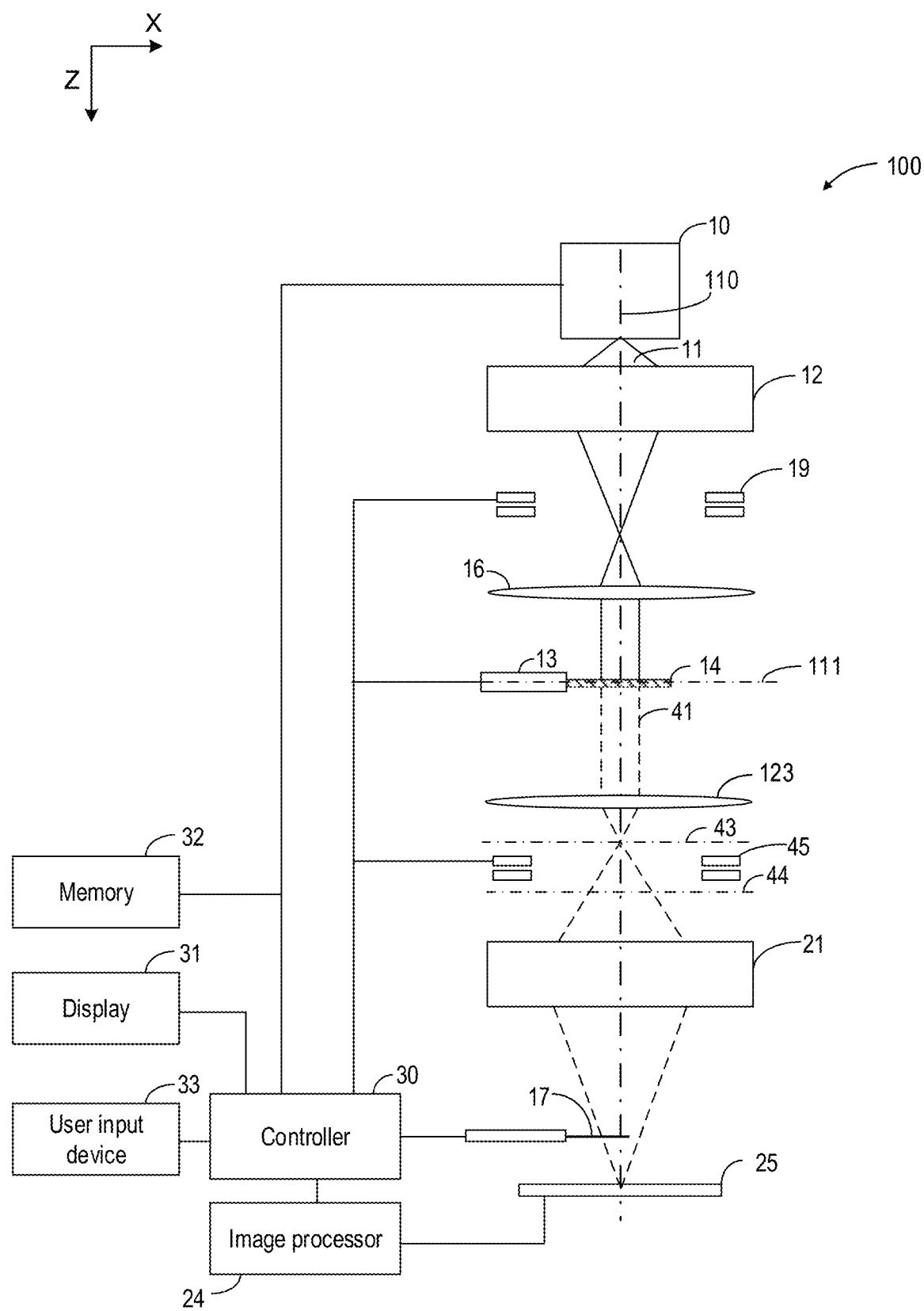
FIG. 1 shows an example transmission electron microscope.

The following description relates to systems and methods for generating diffraction image, such as electron diffraction image, using a direct detection (DD) camera in a charged particle microscopy system. An example of such microscopy system is shown in FIG. 1. The DD camera captures scattered electrons from the sample responsive to irradiation from an electron beam. The DD camera includes a pixelated image sensor with multiple detector pixels. Responsive to an electron impinging the image sensor, pixel voltage is generated at corresponding detector pixel. Pixel voltages of a frame (which may include all detector pixels in the image sensor) may be readout at a high frame rate. Data of each frame are stored and analyzed for generating the diffraction image.

One method for generating the diffraction image is based on particle counting. In particle counting, each electron detection event (that is, the detection of an electron arrives at the detector) is assigned or attributed to a detector pixel. Particle counting can yield high detective quantum efficiency (DQE) due to its lack of detector dark noise. However, one cannot tell if it was one or multiple events causing the measured signal. The DQE may reduce with increased dose rate due to coincidence losses, wherein multiple electrons arrive between two consecutive readouts which cannot be spatially separated. Particle counting is suitable for capturing weak diffraction peaks of beam sensitive sample, such as protein crystals and sensitive organic crystals, wherein low electron dose is used for irradiating the sample. The dose rate of some of the low-resolution diffraction peaks may be high, therefore causes coincidence losses and reduced DQE.

In order to address the above issues, different sets of counting parameter values are used for high dose rate regions and low dose rate regions in a diffraction image generated by counting the electron detection events. In other words, in the diffraction image, values of pixels belonging to the diffraction peaks are determined using a first set of counting parameter values and values of pixels not belonging to the diffraction peaks are determined using a second, different, set of counting parameter values. The diffraction peaks may be identified from multiple acquired frames. For example, pixels belonging to the diffraction peaks are identified from an integrated image obtained by summing up the multiple frames. The counting parameters may include one or more of filter coefficients and camera settings. Each set of counting parameter values can be mapped to, therefore correspond to, a coincidence area. The coincidence area is a minimum detector area to spatially resolve two electron detection events. The coincidence area is a statistical property of the detection process. The first set of counting parameters corresponds to a first coincidence area, and the second set of counting parameters corresponds to a second coincidence area. By using different sets of counting parameter values, that correspond to different coincidence areas, to process the camera readout (i.e. raw measurement data), different regions of the detector may have different sensitivities to the spatial coincidences. The first and second sets of counting parameter values can be determined experimentally or via simulation. In one example, the first set of counting parameter values corresponds to a first, smaller, coincidence area; and the second set of counting parameter values corresponds to a second, larger, coincidence area. As such, a smaller coincidence area is used for diffraction peaks, and a larger coincidence area is used for background. In this way, the DQE at high dose rate is increased for particle counting, and coincidence losses are reduced.

The DQE may further or alternatively be increased in the high dose range by improving the dose rate estimation for the diffraction peaks. In one example, a first dose rate of at least one diffraction peak identified in the acquired multiple frames is estimated in a counting mode. In the counting mode, a dose rate (el/peak/s) of a diffraction peak is estimated based on the statistics of individual electron events in each camera frame during a series of frames. For example, the dose rate is calculated from an event rate of electron detection events at one or more detector pixels. The first dose rate is compared with a threshold dose rate. If the first dose rate is not greater than the threshold dose rate, the first dose rate is a best estimated dose rate for the diffraction peak. If the first dose rate is higher than the first threshold dose rate, a second dose rate of the diffraction peak is estimated in an integrating mode. The best estimated dose rate of the diffraction peak is generated based on both the first and second dose rates. The first and second dose rates are average number of electrons per diffraction peak per second and have a unit of el/peak/s. The best estimated dose rate corresponds to the best signal-to-noise ratio. At the best estimated dose rate, the DQE is not less than a first DQE at the first dose rate in the counting mode or the second DQE at the second dose rate in the integrating mode. The intensity of the diffraction peak in the diffraction image may be determined based on the best estimated dose rate.

Figure 6:
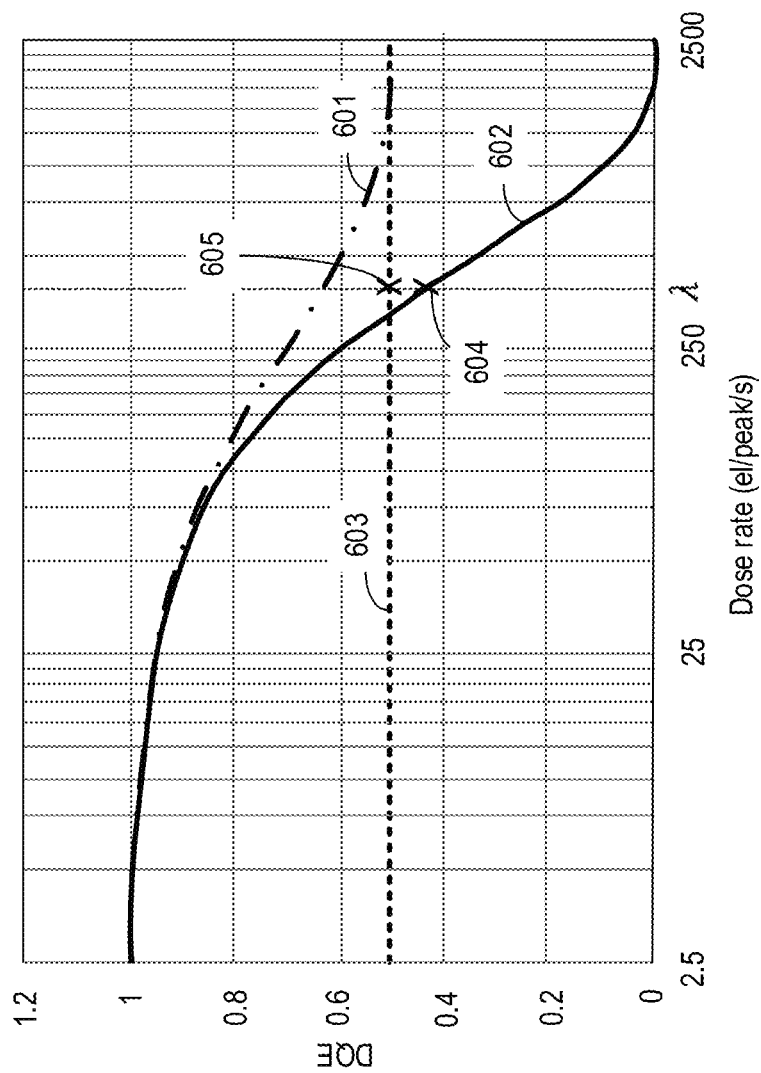
FIG. 6 shows example relationships between detective quantum efficiency and dose rate in different signal processing modes.

In another example, after identifying diffraction peaks from multiple acquired frames, a second dose rate of at least one diffraction peak is estimated in the integrating mode. The second dose rate is compared with a second threshold dose rate. If the second dose rate is not less than the second threshold dose rate, the second dose rate is the best estimated dose rate. If the second dose rate is less than the second threshold dose rate, a first dose rate of the diffraction peak is estimated in the counting mode. The best estimated dose rate is calculated based on both the first and the second dose rates. In the counting mode, the dose rate is estimated based on an event rate of electron detection events corresponding to the diffraction peak. In the integrating mode, the dose rate is estimated based on an accumulated pixel voltage corresponding to the diffraction peak and a detector conversion efficiency. As shown in FIG. 6, the DQE of counting mode decreases with increased dose rate while the DQE of the integrating mode stays constant with increased dose rate. By determining the best estimated dose rate in the combined mode (or in both the counting and integrating modes), the DQE corresponding to the best estimated dose rate is not less than the first DQE at the first dose rate in the counting mode, or the second DQE at the second dose rate in the integrating mode. As such, intensities of diffraction peaks with large dynamic range can be accurately captured. Comparing to the conventional particle counting, the dynamic range of the DD camera may be extended towards higher dose rate without adjusting data readout mechanism.

In some examples, instead of dose rates, first and second average doses (el/peak/frame) of the diffraction peak may be estimated in the counting mode and/or the integrating mode. A best estimated average dose can be determined based on the first and second average doses.

In one example, the dose rate of a diffraction peak is estimated in the counting mode and the integrating mode to generate a first dose rate and a second dose rate, respectively. A best estimated dose rate for the diffraction peak is calculated by weighting the first dose rate and the second dose rate with a weighting factor. The weighting factor may be determined based on the first dose rate and the second dose rate. In some examples, an initial dose rate is determined based on the first and second dose rates. The weighting factor is calculated from a first DQE at the initial dose rate in the counting mode, and a second DQE at the initial dose in the integrating mode. The first and second DQEs may be determined from known DQE versus dose rate relationships, as shown in FIG. 6. In some examples, the best estimated dose rate may be determined iteratively through an optimization process. For each iteration, the weighting factor is updated based on the best estimated dose rate calculated from the previous iteration, and the best estimated dose rate is updated based on the updated weighting factor.

In one example, after acquiring multiple frames of scattered electrons from the sample, an integrated image is generated by summing the multiple frames. One or more diffraction peaks are identified in the integrated image. In other words, detector pixels in the imaging sensor which correspond to each diffraction peak are located. Processing signals of a particular diffraction peak includes processing pixel voltages acquired from the detector pixels corresponding to the diffraction peak. In some examples, dose rates of the diffraction peaks are estimated in both the counting mode and the integrating mode to determine the best estimated dose rate. In some examples, multiple diffraction peaks are grouped into one or more groups, and a weighting factor determined from one diffraction peak in a group may be applied to other diffraction peaks in the group. The diffraction peaks may be grouped by the estimated dose rates in the counting mode and the integrating mode. The diffraction peaks may alternatively be grouped based on their locations, such as their distances relative to the microscope's optical axis or the center of the diffraction pattern in the integrated image.

In one example, a counted image of the diffraction pattern is formed based on counting the electron detection events and an integrated image of the diffraction pattern is formed by integrating (or adding) detected signals. The counted image may be generated based on counting parameters corresponding to the same or different coincidence areas for the diffraction peaks and the background. A diffraction image is generated based on the counted image, integrated image, as well as weighting factors and best estimated dose rate of the diffraction peaks. The diffraction image may be generated by scaling the weighted sum of the counted image and the integrated image with the best estimated dose rates.

In one example, for each diffraction peak, a first dose rate is estimated in the counting mode and a second dose rate is estimated in the integrating mode. Responsive to the first dose rate lower than a first threshold dose rate, the best estimated dose rate is determined in the counting mode. The diffraction image is the counted image scaled by the best estimated dose rate. Responsive to the second rate higher than a second threshold dose rate, the best estimated dose rate is determined in the integrating mode. The diffraction image is the integrated image scaled by the best estimated dose rate. In some examples, the first threshold dose rate is the same as the second threshold dose rate. In other examples, the second threshold dose rate is higher than the first threshold does rate. Responsive to either the first dose rate greater than the first threshold dose rate and/or the second dose rate lower than the second threshold dose rate, the best estimated dose rate is determined in the combined mode, based on a weighted sum of the first dose rate and the second dose rate. The weighting factor for generating the best estimated dose rate may also be applied to the counted image and the integrated image for generating the diffraction image. Diffraction peaks in the diffraction image are scaled based on the best estimated dose. As such, in a single diffraction image including multiple diffraction peaks, intensities of at least two diffraction peaks may be estimated in different modes. As a result, noise in different regions of the diffraction image may have different statistical distribution. For example, noise in a first region including signals processed in the counting mode may have Poisson distribution, and noise in a second region including signals processed in the integrating mode may have Landau distribution.

In one example, the image sensor may be reset after each readout. Through reset, pixel voltage of each detector pixel may be reset to a reset value (such as zero). Raw data readout from each frame may be directly used for analyzing electrons received in each frame. In another example, the camera may be readout according to multi-frame correlative double sampling (mfCDS), as disclosed in U.S. application Ser. No. 13/645,725 by Janssen et al, filed on Oct. 5, 2012, titled "Method for acquiring data with an image sensor", which is incorporated herein by reference in its entirety and for all purposes. In mfCDS, multiple frames of raw data are continuously read out from the image sensor before resetting the image sensor. Difference of sequentially acquired pixel voltages are used for analyzing electrons received in each frame. As such, data collected through the mfCDS mechanism are pre-processed to obtain differential frames before being processed for estimating the best estimated dose rate.

FIG. 1 shows a transmission electron microscopy (TEM) system 100 operated in the selected-area (SA) diffraction mode. The TEM system 100 includes an electron source 10 that emits electron beam 11 along optical axis 110, towards condenser optics 12. The electron source 10 may generate high energy electrons, that is, electrons having typical energies of between about 10 keV and 1,000 keV. In some embodiments, the condenser optics 12 may include one or more condenser lenses and one or more apertures. Deflector 19 positioned downstream of the condenser optics 12 shifts and/or tilts the electron beam relative to the optical axis 110. Pre-sample objective lens 16 positioned downstream of the deflector 19 collimates the electron beam and directs the electron beam onto sample 14. The sample 14 may be held by a sample holder 13 in a specimen plane 111. In some examples, the sample is positioned on a TEM grid attached to the sample holder. The sample holder 13 may adjust sample position by tilting the sample relative to the optical axis and/or translating the sample within the specimen plane. Scattered electrons originating from sample 14 sequentially passes through post-sample objective lens 123 and projector system 21, and are collected by detector 25 positioned on the opposite side of sample 14 relative to electron source 10. The detector 25 may detect the received electrons and send the signal to image processor 24 to form an image. The detector 25 may include an amplifier for amplifying the signal before sending the signal to the image processor 24. In one example, the detector 25 is a direct detection camera. In some embodiments, other detectors may be used for diffraction pattern acquisition and sample image acquisition.

Dashed lines 41 illustrate beam path of unscattered electrons from sample 14 to detector 25. The projector system 21 images the back focal plane 43 of the post-sample objective lens 123 to detector 25. The beam stopper 17 is inserted into the optical axis 110 to block the unscattered beam. The SA aperture may be the positioned in the SA plane 44. Alternatively, a condenser aperture in the condenser optics 12 may serve as beam limiting aperture. In another example, an image deflector may be positioned between the sample and the detector for shifting and tilting the electrons transmitted through the sample back to the optical axis, so that the ED pattern stays centered on the detector during beam tilt and the image stays centered on the detector during beam shift. In some embodiments, the TEM system does not include the beam stopper and the detector receives the unscattered beam.

The controller 30 may control the operation of TEM system 100, either manually in response to operator instructions or automatically in accordance with computer readable instructions stored in non-transitory memory (or computer readable medium) 32. The controller 30 may include a processor and be configured to execute the computer readable instructions and control various components of the TEM system 100 in order to implement any of the methods described herein. The controller 30 may adjust the beam location and/or the beam incident angle on the sample by adjusting the deflector 19. The controller 30 may adjust the electron dose of each ED pattern by adjusting on or more of the settings of the illumination optics, the exposure time of each frame acquired by the detector, and the angular speed for beam tilt/sample rotation. The controller 30 may adjust the magnification by adjusting projector system 21. The controller 30 may further be coupled to a display 31 to display notifications and/or signals detected by detector 25. The controller 30 may receive user inputs from user input device 33. The user input device 33 may include keyboard, mouse, or touchscreen.

Though the TEM system is described by way of example, it should be understood that the sample image and diffraction pattern may be acquired with other charged particle microscopy systems. As another example, the charged particle microscopy system is a scanning transmission electron microscopy (STEM) system. The present discussion of the TEM system is provided merely as an example of one suitable imaging modality.

Figure 2:
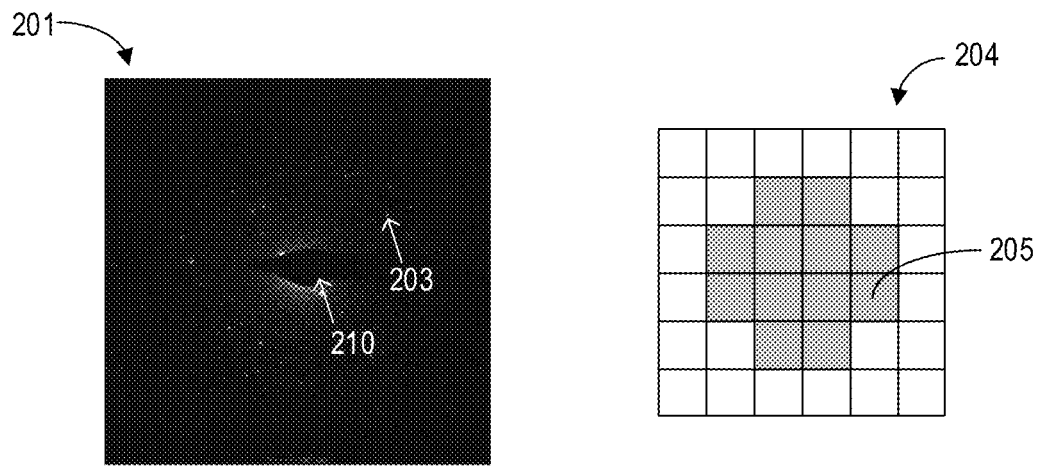
FIG. 2 shows an integrated image and detector pixels corresponding to a diffraction peak in the integrated image.

FIG. 2 shows an example integrated image 201 and illustrates detector pixels corresponding to one diffraction peak. Shadow 210 at the center of the integrated image is caused by the beam stopper for blocking the high intensity unscattered beam. The integrated image 201 includes multiple localized diffraction peaks with a wide dynamic range of dose rate. The low-resolution diffraction peaks located close to the center of the integrated image generally have a higher dose rate per peak than the dose rate of high-resolution diffraction peaks away from the center. The integrated image may be obtained from a pixelated camera including multiple detector pixels. Each of the diffraction peak corresponds to multiple detector pixels. For example, plot 204 illustrates a part of the pixelated camera. Signals from diffraction peak 203 are received from shaded detector pixels 205. Responsive to an electron impinging the detector pixel, a pixel voltage is generated. In some examples, multiple detector pixels may generate none-zero pixel voltages responsive to one electron impinging the camera.

Figure 3:
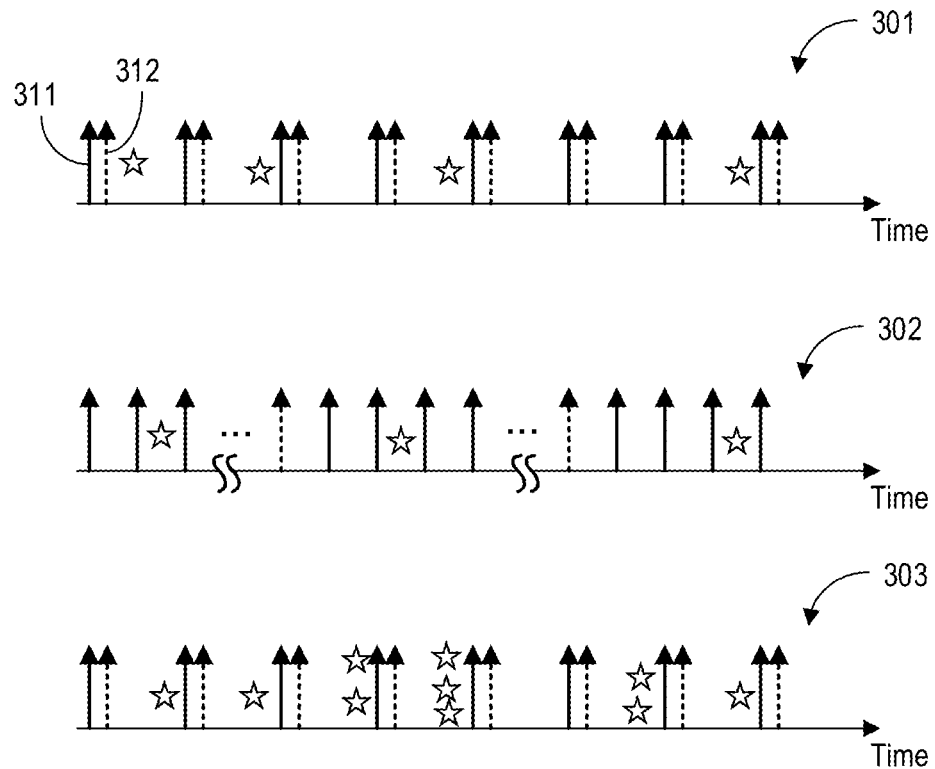
FIG. 3 shows various acquisition mechanisms for reading out data from a camera.

FIG. 3 illustrates example camera readout sequences 301-303 for a diffraction peak at various dose rates. The x-axis indicates time. The solid arrow 311 indicates frame readout and dashed arrow 312 indicates camera reset. Each star indicates an electron arrived at the detector pixels corresponding to a diffraction peak. The camera is reset immediately after each frame readout. In sequence 301, the dose rate is low so that no more than one electron arrives between two consecutive readouts. Sequence 302 corresponds to mfCDS, wherein the camera is reset after multiple frame readouts. Similar to 301, the dose rate is low in 302, and no more than one electron arrives between two consecutive readouts. In sequence 303, similar to 301, the camera is operated at the same frame rate and is reset after each frame readout. However, different from 301, the dose rate is higher and multiple electrons may arrive between consecutive readouts. If signals received in sequence 303 are processed in the counting mode, DQE would be low due to the coincidence loss.

Figure 4:
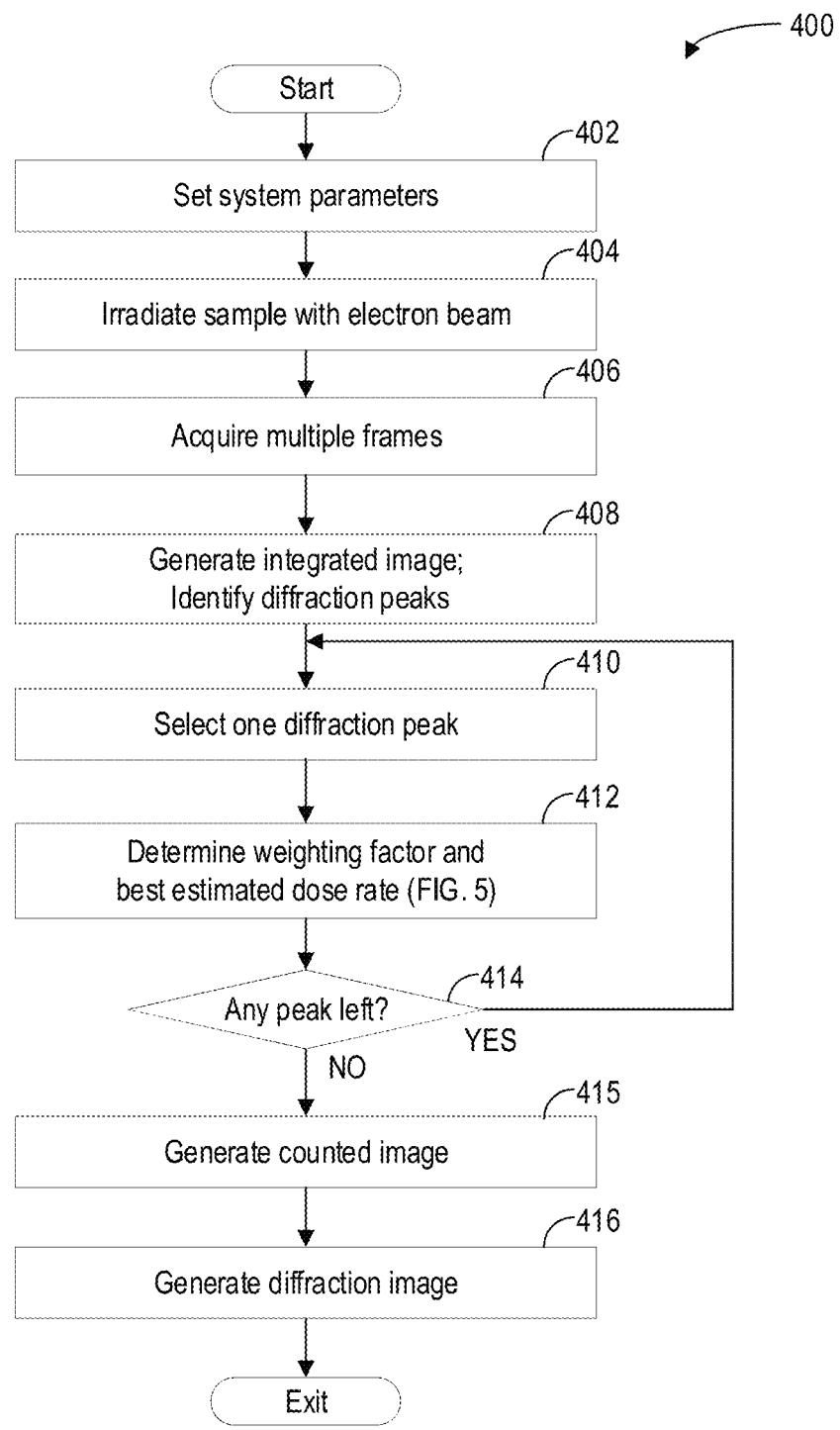
FIG. 4 is an example method for generating a diffraction image.

FIG. 4 shows method 400 for generating a diffraction image based on signals acquired with a DD camera. The diffraction peaks are identified. The intensity of each identified diffraction peak in the diffraction image is determined based on a best estimated dose rate, which is estimated based on the dose rates estimated in both the counting mode and the integrating mode.

At 402, the system parameters are set. The system parameters may include electron dose rate at the sample, camera readout sequence, and readout frame rate. The electron dose rate may be determined based on sample property. For example, the electron dose rate is reduced for beam sensitive samples. The camera readout sequence may be adjusted based on an expected dose rate at the camera. As shown in FIG. 3, in different readout sequence, the camera may be reset after each readout, or after multiple readouts. Further, at 402, a region of interest (ROI) of the sample may be identified and moved into the field of view. For example, the ROI may be determined based on a low-resolution sample image.

At 404, the electron beam is directed to the ROI. In one example, the electron beam is a parallel or quasi-parallel beam. In another example, the electron beam is a nanoprobe beam. At 406, the camera acquires multiple frames at a frame rate determined at 402. Each frame contains the pixel voltages of multiple detector pixels of the camera. Each frame is stored separately.

At 408, an integrated image is generated, and diffraction peaks in the acquired frames are identified and located in the integrated image. In one example, an integrated image is generated by summing up all the frames acquired from the ROI at 406. In the integrated image, a single electron may contribute to pixel values of more than one pixel. The diffraction peaks correspond to the high intensity regions in the integrated image. The diffraction peaks can be identified by their localized peak intensity. Detector pixels corresponding to each diffraction peak are identified. For example, as shown in FIG. 2, detector pixels 205 correspond to the pixels in the integrated image 201 which have a pixel value greater than the threshold intensity.

At 410, one of the identified diffraction peaks is selected. In other words, detector pixels corresponding to the selected diffraction peak are selected and signals received from these selected detector pixels are used for generating the weighting factor and the best estimated dose rate of the selected diffraction peak at 412.

At 412, the weighting factor and the best estimated dose rate for the selected diffraction peak are determined based on the first dose rate estimated in the counting mode and/or the second dose rate estimated in the integrating mode. The best estimated dose rate may be a weighted sum of the first and second dose rates estimated in the counting mode and the integrating mode. The weighting factors range from zero to one. The sum of the weighting factors for the counting and integrating mode is one. In one example, the best estimated dose rate $\lambda_{best}$ is calculated as first and second dose rates weighted by the weighting factor $\varepsilon$ and $(1-\varepsilon)$, respectively:

$$\lambda_{best} = \varepsilon \lambda_1 + (1-\varepsilon)\lambda_2. \qquad \text{Equation 1}$$

Figure 5:
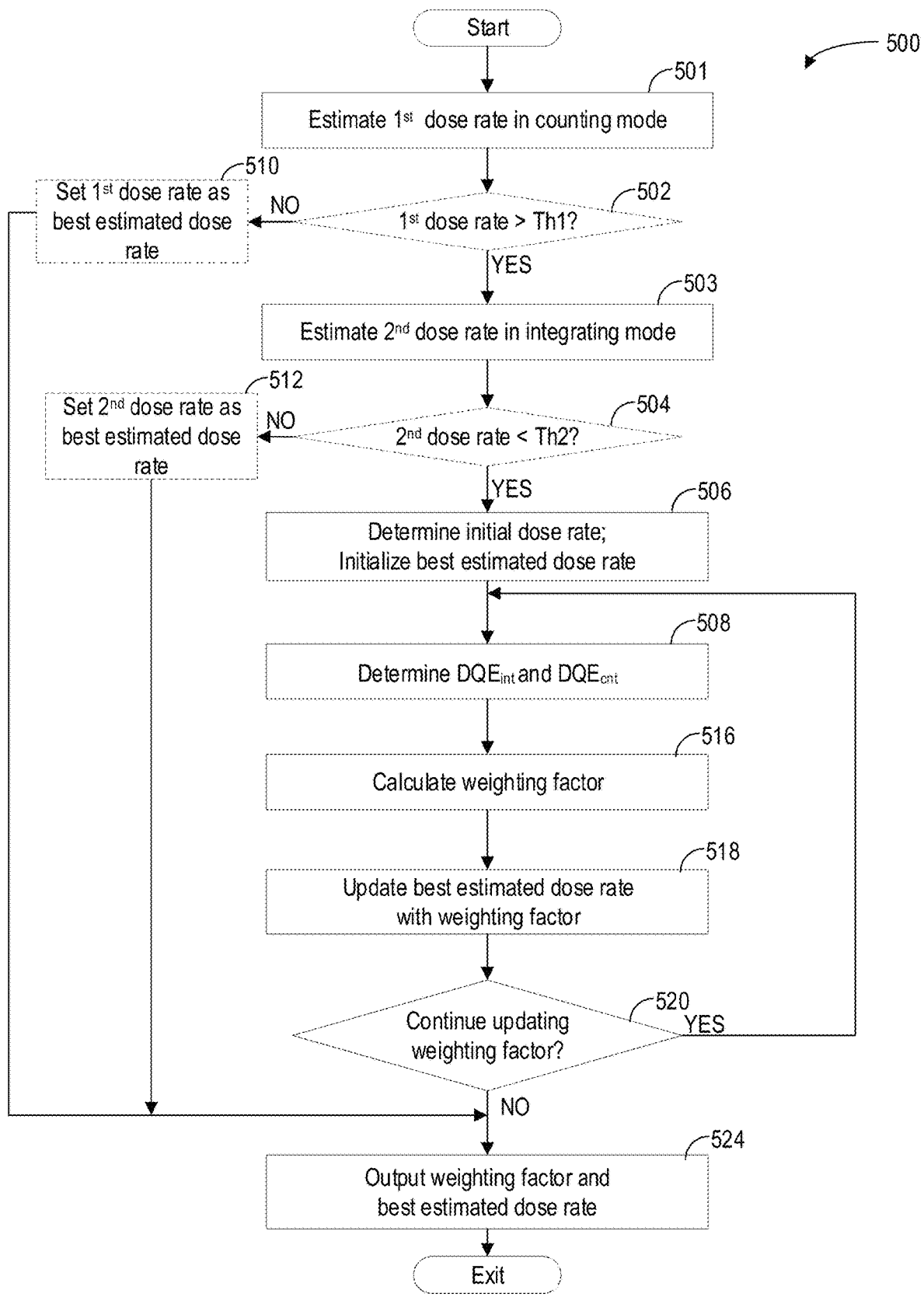
FIG. 5 is a flowchart for determining a weighting factor and a best estimated dose rate of a diffraction peak.

Detailed procedures for determining the weighting factor and the best estimated dose rate are described in FIG. 5.

At 414, method 400 checks whether signal from any other diffraction peak needs to be processed. If the answer is YES, another diffraction peak is selected at 410. Otherwise, method 400 proceeds to 416.

At 415, a counted image is generated from the multiple frames. The counted image is generated by counting the electron detection events, wherein each event of an electron arriving at the camera (i.e. election detection event) is attributed to a pixel. In one example, for an optimal counted image, it is useful to make a distinction between the diffraction peaks and the continuous background in the diffraction pattern. Spatial coincidences (two events in a single frame are so close by that they cannot be separated) will happen more often in diffraction peak regions than in the background region. In order to reduce the coincidence loss, different sets of counting parameter values are used for processing signals in different regions of the counted image. The counting parameter values are camera/detector specific. The counting parameters may include filter coefficients used to perform filter operation on the camera readout. The counting parameters may also include one or more camera settings including gain, readout order, signal quantization and timing. Each set of counting parameter values corresponds to a coincidence area. The coincidence area relates to how well can two electron detection events be spatially resolved. The counting parameter values are selected so that the coincidence area is smaller in the diffraction peak region and larger in the background region. For example, the coincidence area is 4×4 detector pixels for the diffraction peak, and 16×16 detector pixels for the background. A small coincidence area makes it easier to spatially distinguish two events, which is useful in the peak region. The disadvantage of a small coincidence area is the increase of spurious detections. The tradeoff between these two effects will be different for the background region than for the peak region. By using a smaller coincidence area for the diffraction peak region, the DQE is increased at higher dose rate. In another example, the entire counted image is generated using one set of counting parameters. In yet another example, the counted image is generated using counting parameters corresponding to the same coincidence area throughout the entire image.

At 416, a diffraction image includes the multiple diffraction peaks may be generated based on the integrated image from step 408, the counted image from step 415, the weighting factor and best estimated dose of each diffraction peak. In one example, a weighted image may be generated by a weighted sum of integrated image and the counted image using the weighting factors. The diffraction image is then generated by scaling the diffraction peaks with the best estimated doses. In another example, for each pixel belonging to a particular diffraction peak, a pixel value in the weighted image is calculated by a weighted sum of the pixel value in the counted image and the pixel value in the integrated image. For example, the pixel value in the weighted image is the sum of the pixel value in the counted image multiplied by weighting factor $\varepsilon$ from 412 and the pixel value in the integrated image multiplied by $(1-\varepsilon)$. For pixels not belonging to any diffraction peak (i.e. background pixels), the pixel values in the weighted image are the same as the corresponding pixel values in the counted image. The diffraction peaks in the weighted image are then scaled based on the best estimated dose rate to generate the diffraction image. Through scaling, the sum of all pixel values of each diffraction peak in the diffraction image is proportional to its best estimated dose rate.

In some embodiments, a moving estimation (or generation) of the best estimated dose rates and/or diffraction images are performed on the acquired frames at 406. For example, at one time point, a subset of the acquired frames, such as frame 1 to N, acquired at 406 are processed to generate a diffraction image. For a later time point, later acquired frames, such as frame n to n+N (n≥1), are processed to generate another best estimated dose rate and diffraction image. In some examples, changes in the dose rate may be monitored based on a variation of the second dose rate estimated in the integrating mode, and this variation can be added to the Poisson statistic to make better estimation of the dose rate in the counting mode.

In this way, the dose rate of a diffraction peak may be estimated the counting mode, the integrating mode, or the combined mode. In the combined mode, the dose rate estimated from the counting and integrating modes are combined to generate the best estimated dose rate. The estimation described in method 600 extends the dynamic range of the conventional counting mode.

Diffraction image generated through method 400 may contain diffraction peaks generated based on dose rate estimation in any one of the counting mode (best estimated dose rate equals the first dose rate), the integrating mode (best estimated dose rate equals the second dose rate), and the combined mode (best estimated dose rate includes a fraction of the first dose rate and a fraction of the second dose rate). In one example, dose rate of low-resolution diffraction peaks are estimated in the integrating mode, and dose rate of high-resolution diffraction peaks are estimated in the counting mode. In another example, dose rate of mid-resolution diffraction peaks are estimated in the combined mode. As a result, different regions of the generated diffraction image may have different noise distribution. For example, the counting mode results in regions with Poisson noise distribution, and the integrating mode results in regions with Landau noise distribution.

FIG. 5 shows method 500 for determining the weighting factor and the best estimated dose rate of the selected diffraction peak based on the first dose rate and/or the second dose rate estimated in the counting mode and the integrating mode, respectively.

At 501, the first dose rate of the selected diffraction peak is estimated in the counting mode. In one example, the first dose rate is calculated from an event rate of electron detection events. The arrival rate of electrons is described by a Poisson distribution. The probability that in a single frame, k electrons of a single diffraction peak are hitting the camera is $$P_k = \frac{D^k e^{-D}}{k!}.$$
Equation 2 wherein D is the average dose (el/peak/frame). The dose rate $\lambda$ (el/peak/s) can be obtained by multiplying the average dose D with frame rate F (frame/s). As an example, for a dose rate of 10 el/peak/s, frame rate of 250 frame/s, the average dose is 10/250=0.04 el/peak/frame. At this low dose rate, one event consists one electron of the diffraction peak hits the camera. At a higher dose rate, some events will consist of multiple electrons, as shown in 303 of FIG. 3.

The probability that there is no event (no electron arrives the camera) between consecutive frame readout is $$P_0 = e^{-D}$$
Equation 3 and the probability of an event (with one or more electrons of the diffraction peak arrive the camera) between consecutive frame readout is $$P_{ev} = 1 - P_0.$$
Equation 4

Thus, the first dose rate $\lambda_1$ can be calculated from either the probability of no event, or the probability of an event:

$$\lambda_1 = -\text{Ln}(P_0) \cdot F = -\ln(1 - P_{ev}) \cdot F.$$
Equation 5

At 502, the first dose rate is compared with a first threshold dose rate. If the first dose rate is not greater than the first threshold dose rate, the first dose rate is set as the best estimated dose rate. The weighting factor may be set accordingly. For example, the weighting factor $\varepsilon$ in Equation 1 is set to 1. The first threshold dose rate may be determined based on one or more of the electron dose rate at the sample, sample type, and the frame rate. If the first dose rate is greater than the first threshold dose rate, method 500 proceeds to 503.

At 503, the second dose rate $\lambda_2$ is estimated in the integrating mode. The second dose rate may be calculated based on the pixel voltages of the detector pixels corresponding to selected diffraction peak and the conversion efficiency of the camera. For example, the second dose rate is the product of the second average dose with the frame rate, wherein the second average dose is calculated by dividing the sum of the pixel values corresponding to the selected diffraction peak in the integrated image by the conversion efficiency.

At 504, the second dose rate is compared with a second threshold dose rate. If the second dose rate is not less than the second threshold dose rate, the second dose rate is set as the best estimated dose rate. The weighting factor may be set accordingly. For example, the weighting factor $\varepsilon$ in Equation 1 is set to 0. The second threshold dose rate may be equal or greater than the first threshold dose rate. The second threshold dose rate may be determined based on one or more of the electron dose rate at the sample, sample type, and the frame rate. If the second dose rate is less than the second threshold dose rate, the initial dose rate is determined at 506.

At 506, an initial dose rate is determined. The best estimated dose rate is initialized with the initial dose rate. In one example, the initial dose rate is calculated based on the first dose rate and/or the second dose rate. The initial dose rate may equal to the first dose rate or the second dose rate. The initial dose rate may be the mean of the first dose rate and the second dose rate. In one example, the initial dose rate may be a predetermined dose rate, such as the dose rate corresponds to an average dose rate of 1 el/peak/frame.

At 508, $DQE_{cnt}$ and $DQE_{int}$, which are the DQEs at the current best estimated dose rate in the counting mode and the integrating mode, respectively, are determined based on the predetermined DQE-dose rate relationships. The DQE-dose rate relationship is different for different camera and operation conditions of the camera. The DQE-dose rate relationship may be determined via mathematical calculation, simulation, or experiments. $DQE_{cnt}$ and $DQE_{int}$ at a specific dose rate are determined from plots 602 and 603 shown in FIG. 6 or lookup tables derived from the plots.

FIG. 6 shows example plots of DQE versus dose rate in the counting mode, integrating mode, and the combined mode. The camera operates at a frame rate of 250 frame/s. In this example, the DQE 602 of counting mode is close to 1 at very low dose rate and starts to decrease fast when the dose rate is greater than 25 el/peak/s. The DQE 603 of the integrating mode is relatively constant at 0.5. At a dose rate around 300 el/peak/s, the DQE 602 of the counting mode is lower than the DQE 603 of the integrating mode. At any dose rate, the combined mode has a DQE 601 not lower than either DQE 602 of the counting mode or DQE 603 of the integrating mode. For example, at the current best estimated dose rate λ, the $DQE_{cnt}$ is 604 and $DQE_{int}$ is 605.

At 516, the weighting factor is calculated based on $DQE_{cnt}$ and $DQE_{int}$ from step 508. For example, the variances of the output signal in the integrating mode and the counting mode are calculated from their respective DQEs:

$$\sigma_{int}^2 = \sigma_{in}^2 \left( \frac{1}{DQE_{int}} - 1 \right) \quad \text{Equation 7}$$

$$\sigma_{cnt}^2 = \sigma_{in}^2 \left( \frac{1}{DQE_{cnt}} - 1 \right) \quad \text{Equation 8}$$

wherein $\sigma_{int}^2$ and $\sigma_{cnt}^2$ are variances of output signal in the integration mode and the counting mode, respectively. $\sigma_{in}^2$ is the input signal variance. The weighting factor ε can be obtained as:

$$\varepsilon = \frac{\sigma_{cnt}^2}{\sigma_{int}^2 + \sigma_{cnt}^2} = \frac{b}{a+b}, \quad \text{Equation 9}$$

wherein $$a = \frac{1}{DQE_{int}} - 1$$

and $$b = \frac{1}{DQE_{cnt}} - 1.$$

At 518, the best estimated dose rate is updated based on the weighting factor, the first dose rate and the second dose rate. In one example, the weighting factor ε may be applied to the first and second dose rates of a particular diffraction peak as shown in Equation 1 to obtain the best estimated dose rate.

At 520, method 500 checks whether the weighting factor needs to be updated. In one example, the weighting factor is calculated only once, and the weighting factor and the best estimated dose rate generated at 518 is outputted at 524. In some examples, the weighting factor and the best estimated dose rate are determined iteratively through an optimization process, wherein the updated best estimated dose rate is set as the current best estimated dose rate and used to calculate the input signal variance at 514. The weighting factor update may be terminated after a predetermined number of iterations. Alternatively, the weighting factor update may be terminated when the difference between the change of the best estimated dose rate and/or the weighting factor is less than a threshold value. If method 500 determines not updating the weighting factor, the current weighting factor and the best estimated dose rate are outputted to method 400. Otherwise, if the weighting factor and the best estimated dose rate is to be updated, method 500 proceeds to 508, wherein the $DQE_{cnt}$ and $DQE_{int}$ are updated based on the current best estimated dose rate.

By processing the readout frames in the combined mode, the DQE at the best estimated dose rate is not lower than the DQE at the first dose rate in the counting mode or the DQE at the second dose rate in the integrating mode. When the dose rate at the camera is low (such as lower than 25 el/peak/s), the best estimated dose rate is close to the first dose rate. When the dose rate is high (such as higher than 750 el/peak/s), the best estimated dose rate is close to the second dose rate. In some examples, the first dose rate and the second dose rate of all diffraction peaks can be determined before selecting the diffraction peak at 410.

Figure 7:
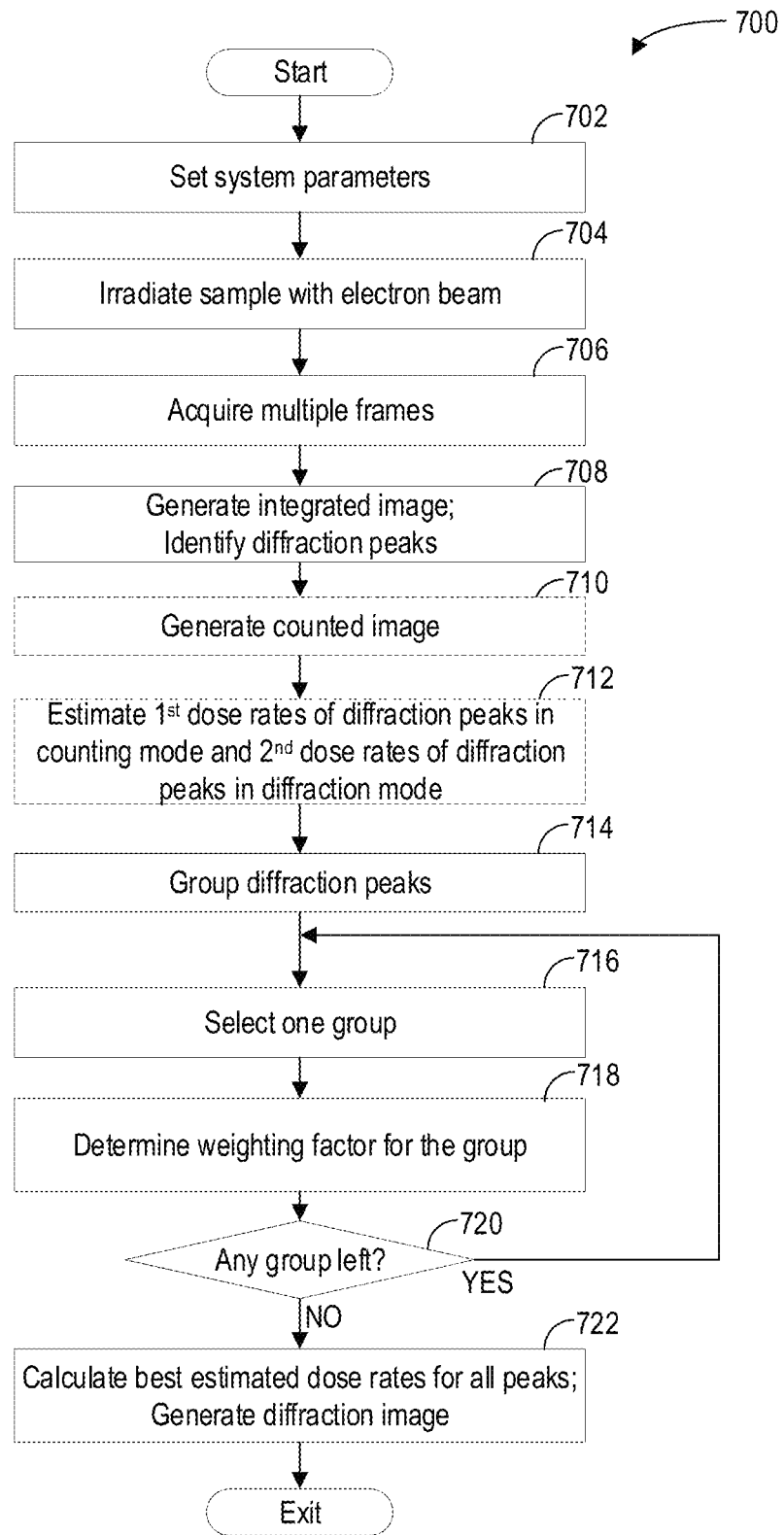
FIG. 7 is another example method for generating a diffraction image.

FIG. 7 shows another example method 700 for generating a diffraction image based on signals acquired with a DD detector. Different from method 400 of FIG. 4, in method 700, the diffraction peaks are grouped so that signals of the diffraction peaks in the same group are processed in the same mode (counting, integrating, or combined). In some examples, the same weighting factor is applied to diffraction peaks in the same group.

At 702-708, similar to steps 402-408 of FIG. 4, after setting system parameters, multiple frames are acquired responsive to irradiating the sample with the electron beam. Detector pixels corresponding to each diffraction peak in the multiple frames are identified.

At 710, similar to 415 of FIG. 4, a counted image is generated from the multiple frames.

At 712, the first dose rates and the second dose rates of all diffraction peaks are optionally calculated in the counting mode and the integrating mode, respectively. The first and second dose rates for each diffraction peak may be calculated as described in steps 501 and 503 of FIG. 5.

At 714, the diffraction peaks are grouped into one or more groups. In one example, the diffraction peaks are grouped based their locations relative to the best estimated axis, resolutions, or the distances from the center of the diffraction pattern. Diffraction peaks within a certain range of distance from the best estimated axis may be grouped together. In another example, the diffraction peaks are grouped based on their first dose rates and the second dose rates. Diffraction peaks with the first dose rate and/or second dose rate in a predetermined dose rate range may be grouped together.

At 716, one group determined at 714 is selected. At 718, the weighting factor for the group is calculated. The weighting factor may be calculated based on the first and second dose rates of a diffraction peak in the group, as shown in FIG. 5.

At 720, method 700 checks whether there is any group left for calculating the weighting factor. If the answer is YES, method 700 proceeds to 716 to select another group. If the weighting factors for all groups are determined, method 700 proceeds to 722.

At 722, the best estimated dose rates for all diffraction peaks are calculated based on their respective first and second dose rates, as well as the weighting factor of the corresponding group. The best estimated dose rate may be calculated according to Equation 1. Further, a diffraction image including the multiple diffraction peaks may be generated, wherein the intensities of the diffraction peaks are proportional to their respective best estimated dose rates.

By processing the diffraction peaks in groups, the overall signal-to-image time may be reduced, without sacrificing the image quality.

The technical effect of generating a diffraction image using counting parameters corresponding to different coincidence areas is to reduce coincidence losses at the diffraction peaks. comparing the dose rate estimated in the counting mode with a threshold dose rate is that the DQE at high dose rate can be improved by estimating the best estimated dose rate in the combined mode. The technical effect of estimating a dose rate of a diffraction peak in both the counting mode and the integrating mode is to increase the DQE in a wide range of dose rates. Comparing to estimating the dose rate in only the counting mode, in the combined mode, the DQE at a higher dose rate is less affected by the coincidence loss. The technical effect of generating a weighting factor is to combine the dose rates calculated in the counting mode and the integrating mode and to generate a best estimated dose rate. The intensity of the diffraction peak in the diffraction image is then determined based on the best estimated dose rate. The technical effect of iteratively searching for the best estimated dose rate is to find the dose rate with highest DQE. The technical effect of identifying the diffraction peaks in the integrated image is that detector pixels corresponding to a particular diffraction peak can be accurately identified due to the high contrast of diffraction peaks in the integrated image.

In another presentation, a method comprises: irradiating a sample with an electron beam; acquiring multiple frames from a detector; identifying multiple diffraction peaks in the multiple frames; estimating a first dose rate of at least one diffraction peak in the identified diffraction peaks in a counting mode, wherein the first dose rate is not greater than a threshold dose rate; and generating a diffraction image including the diffraction peak by counting electron detection events, wherein values of pixels belonging to the diffraction peak are determined using a first set of counting parameter values corresponding to a first coincidence area, values of pixels not belonging to any of the multiple diffraction peaks are determined using a second set of counting parameter values corresponding to a second, different, coincidence area.

In yet another presentation, a method comprises: irradiating a sample with an electron beam; acquiring multiple frames from a detector; identifying multiple diffraction peaks in the multiple frames; estimating a first dose rate of at least one diffraction peak in the identified diffraction peaks in a counting mode, wherein the first dose rate is higher than a threshold dose rate; a second dose rate of the diffraction peak in an integrating mode; determining a best estimated dose rate of the diffraction peak based on the first dose rate and the second dose rate; and generate a diffraction image based on the best estimated dose rate.

What is claimed is:

1. A method comprising:
irradiating a sample with an electron beam;
acquiring multiple frames from a detector;
identifying multiple diffraction peaks in the multiple frames; and
generating a diffraction image including the multiple diffraction peaks from the multiple frames by counting electron detection events, wherein values of pixels belonging to at least a first diffraction peak of the multiple diffraction peaks are determined using a first set of counting parameter values corresponding to a first coincidence area, and values of pixels not belonging to the first diffraction peak are determined using a second set of counting parameter values corresponding to a second, different, coincidence area, and an intensity of the first diffraction peak is determined based on a first dose rate of the first diffraction peak estimated in a counting mode.

2. The method of claim 1, wherein estimating the first dose rate of the first diffraction peak in the counting mode includes estimating the first dose rate based on an event rate of electron detection events corresponding to the first diffraction peak.

3. The method of claim 1, wherein an intensity of at least a second diffraction peak of the multiple diffraction peaks is determined based on a second dose rate of the second diffraction peak estimated in an integrating mode.

4. The method of claim 3, wherein estimating the second dose rate of the second diffraction peak in the integrating mode includes estimating the second dose rate based on an accumulated signal corresponding to the second diffraction peak from the multiple frames and a detector conversion efficiency.

5. The method of claim 4, wherein the intensity of the second diffraction peak is determined further based on a third dose rate of the second diffraction peak estimated in the counting mode.

6. The method of claim 3, wherein different regions of the diffraction image include noises of different statistical distributions.

7. A charged particle microscope, comprising:
an electron source for generating an electron beam;
a sample holder for positioning the sample;
a pixelated detector for receiving electrons from the sample; and
a controller including a non-transitory memory for storing computer readable instructions, by executing the instructions with a processor, the controller is configured to:
irradiate the sample with the electron beam;
acquire multiple frames with the detector;
estimate a first dose rate of at least a diffraction peak in the acquired frames in a counting mode;
responsive to the first dose rate not greater than a threshold dose rate, generate a diffraction image including the diffraction peak by counting electron detection events, wherein values of pixels belonging to the diffraction peak are determined using a first set of counting parameter values corresponding to a first coincidence area, and values of pixels not belonging to any of the multiple diffraction peaks are determined using a second set of counting parameter values corresponding to a second, different, coincidence area;
responsive to the first dose rate higher than a threshold dose rate, estimate a second dose rate of the diffraction peak in an integrating mode;

determine a best estimated dose rate of the diffraction peak based on the first dose rate and the second dose rate; and generate the diffraction image, wherein an intensity of the diffraction peak is determined based on the best estimated dose rate.

8. The charged particle microscope of claim 7, wherein acquire multiple frames with the detector includes continuously reading out from multiple detector pixels multiple times before resetting the detector; and obtain the multiple frames by subtracting consecutive readouts.

9. The charged particle microscope of claim 7, wherein determine a best estimated dose rate of the diffraction peak based on the first dose rate and the second dose rate includes: determine an initial dose rate; determining a first DQE corresponding to the initial dose rate in the counting mode; determining a second DQE corresponding to the initial dose rate in the integrating mode; calculating a weighting factor based on the first DQE and the second DQE; and determining the best estimated dose rate by calculating a weighted sum of the first dose rate and the second dose rate using the weighting factor.

\* \* \* \* \*